United States Patent
Wu et al.

(10) Patent No.: US 7,099,789 B1
(45) Date of Patent: Aug. 29, 2006

(54) CHARACTERIZING DISTRIBUTION SIGNATURES IN INTEGRATED CIRCUIT TECHNOLOGY

(75) Inventors: Franklyn Shihyu Wu, Berkeley, CA (US); Jeffrey P. Erhardt, San Jose, CA (US); Paul J. Steffan, Elk Grove, CA (US); Jerry H. G. Tsiang, Cupertino, CA (US); Shivananda S. Shetty, Sunnyvale, CA (US); John J. Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/934,121

(22) Filed: Sep. 2, 2004

(51) Int. Cl.
*G01R 31/00* (2006.01)

(52) U.S. Cl. .................. 702/117; 324/522; 324/765

(58) Field of Classification Search ............... None
See application file for complete search history.

(56) References Cited

U.S. PATENT DOCUMENTS 6,477,685 B1 * 11/2002 Lovelace ................. 716/4
2002/0022936 A1 * 2/2002 Stanke ..................... 702/81
2003/0002878 A1 * 1/2003 Singh et al. ............. 396/611
2003/0140294 A1 * 7/2003 Sagatelian et al. ........ 714/732

OTHER PUBLICATIONS

Khubchandani, R. "A Fast Test to Generate Flash Memory Threshold Voltage Distribution Map", Aug. 9-10, 1999 IEEE International Workshop on Memory Technolgoy, Design and Testing, San Jose, CA, USA pp. 78-82.*

* cited by examiner

*Primary Examiner*—Marc S. Hoff
*Assistant Examiner*—Manuel L Barbee
(74) *Attorney, Agent, or Firm*—Mikio Ishimaru (57) ABSTRACT

A method and system of processing tester information of a system under test is provided. Data of a tested characteristic of the system under test is generated. A distribution curve is extracted from the data. A signature of the distribution curve is determined, and a map of the signature on a depiction of the system under test is presented. The distribution curve also can be categorized in a plurality of bins, and bitmaps are generated for the sections in each of the plurality of bins. Systematic signatures are determined from the bitmaps in the block, and the signatures are correlated with the locations on the system under test.

22 Claims, 6 Drawing Sheets

CHARACTERIZING DISTRIBUTION SIGNATURES IN INTEGRATED CIRCUIT TECHNOLOGY

BACKGROUND

1. Technical Field

The present invention relates generally to semiconductor technology and more specifically to semiconductor research and development.

2. Background Art

Presently, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems.

The problems include, but are not limited to, characteristic distribution curves for a particular group, or lot, of wafers can be meaningful, however, it is difficult to sort through all the distribution curves for a particular lot of wafers and recall their characteristics much less analyze them in a meaningful way. Additionally, finding the "location" of bits in a device that have a "higher" or "lower" threshold voltage than the specified voltage is difficult. Determining voltage threshold within a memory sector, or a standard voltage threshold distribution of all bits in a sector gives no information about systematic non-uniformities.

There also is a lack of the ability to perform hierarchical voltage threshold analysis.

Solutions to these problems have been long sought but prior developments have not taught or suggested any solutions and, thus, solutions to these problems have long eluded those skilled in the art.

DISCLOSURE OF THE INVENTION

The present invention provides a method of processing tester information of a system under test. Data of a tested characteristic of the system under test is generated. A distribution curve is extracted from the data. A signature of the distribution curve is determined, and a map of the signature on a depiction of the system under test is presented.

The present invention provides a system for determining geographical location signatures of a system under test that includes: means for obtaining parameter distribution for sections of a system under test; means for categorizing the parameter distribution in a plurality of bins; means for generating maps for the sections in each of the plurality of bins; means for determining systematic signatures from the maps; and means for correlating the signatures with the location thereof on the system under test.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
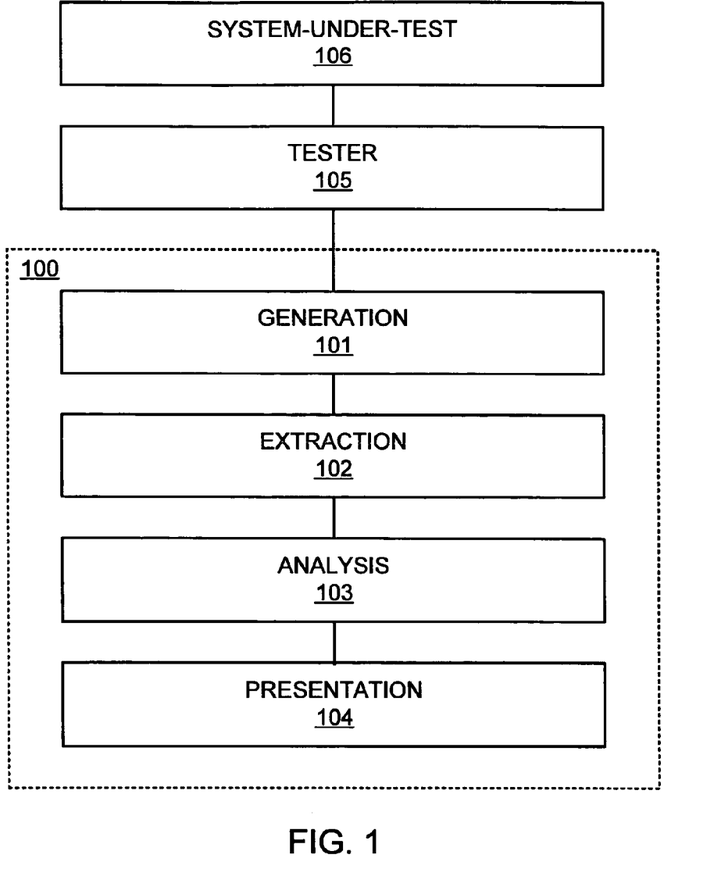
FIG. 1 is a block diagram of a tester information processing system according to the present invention.

Referring now to FIG. 1 therein is shown a block diagram of a tester information processing system 100 according to the present invention. The tester information processing system 100 is the result of the discovery that at times, a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information." The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. The information may be generated using the tester 105 itself, conventional test information, a personal computer, etc. It may also require new equipment and/or methods, which are described herein when required.

In the extraction block 102, usable information is extracted from the generated information from the generation block 101. Essentially, the generated information is translated into forms that are more useful; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
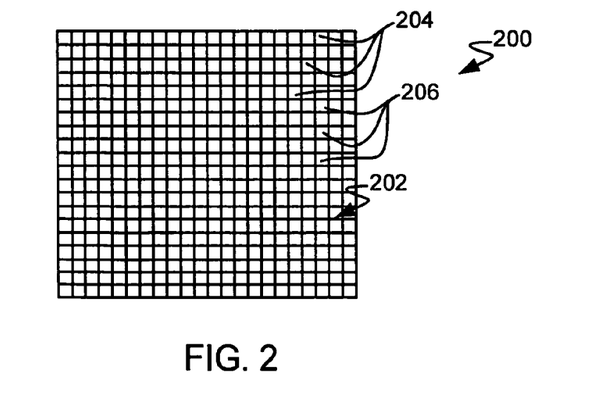
FIG. 2 is a view of a circuit chip, such as a flash memory die containing a plurality of memory transistors or bits.

Referring now to FIG. 2 therein is shown a circuit chip, such as a die 200, for example, a flash memory die. The die 200 has a number of bits 202, such as memory cells. The number of bits 202 may be divided into a number of odd numbered row bits 204 and a number of even numbered row bits 206. Each of the number of bits 202 has a "threshold voltage," which is a voltage that must be applied to a control gate of a bit to cause conduction through a channel region during a read operation on the flash memory cell.

The programming operations on the flash memory cell involve the application of a relatively large constant voltage to a drain junction of the flash memory cell while an even larger voltage is applied to the control gate. During such a programming operation, the source junction of the flash memory cell is maintained at a ground level or a zero voltage level in relation to the voltages applied to the control gate and drain junction. Such a relatively high voltage potential applied between the drain and source junctions causes electrons to flow through the channel region from the source to the drain junction. The electrons flowing between the source and drain can attain relatively high kinetic energy levels near the drain junction.

In addition, the high constant voltage applied to the control gate raises the voltage potential of the floating gate to a high level at the start of the programming operation. Such a high voltage potential on the floating gate usually attracts the electrons flowing through the channel region. Under these conditions, electrons in the channel region having sufficiently high kinetic energy migrate through the tunnel oxide layer and onto the floating gate. This phenomenon is commonly referred to as "hot carrier programming" or "hot carrier injection." A successful programming operation involves the injection of sufficient numbers of electrons onto the floating gate to achieve a desired threshold voltage for the flash memory cell. The time involved in a programming operation depends upon the rate at which electrons are injected onto the floating gate. The slower the rate of injection, the longer the programming time required to reach the desired threshold voltage.

With such programming techniques, the relatively high voltage potential of the floating gate at the start of the programming operation is reduced as electrons accumulate on the floating gate. Such a reduction in the voltage potential of the floating gate causes a corresponding reduction in the rate of electron injection onto the floating gate. Such a reduction in the rate of electron injection increases the time required to program a flash memory cell to the desired threshold voltage. Such increased programming time slows the overall speed of flash memory devices that employ such programming techniques.

In addition, a hot carrier programming technique results in the formation of electron-hole pairs in the channel region of the flash memory cell near the drain junction. The electron-hole pairs are formed when high-energy electrons bombard the crystal lattice structure of the silicon substrate and dislodge other electrons from the lattice. Moreover, the portions of the channel region near the drain junction usually have a relatively high voltage potential due to the high voltage applied to the drain junction. Consequently, the voltage potential of the floating gate can fall below the voltage potential of the portion of the channel region located near the drain junction as the voltage level on the floating gate decreases during programming. Under this condition, holes from the electron-hole pairs that are created in the channel region near the drain junction can migrate throughout the tunnel oxide layer and onto the floating gate. Such migration of holes onto the floating gate causes surface damage to the tunnel oxide layer. Such surface damage usually causes long-term reliability problems in the flash memory cell by reducing the rate of injection of electrons onto the floating gate during programming. In addition, such surface damage can interfere with current flow through the channel region of the flash memory cell during a read operation that also results in a reduction in long-term reliability.

Figure 3:
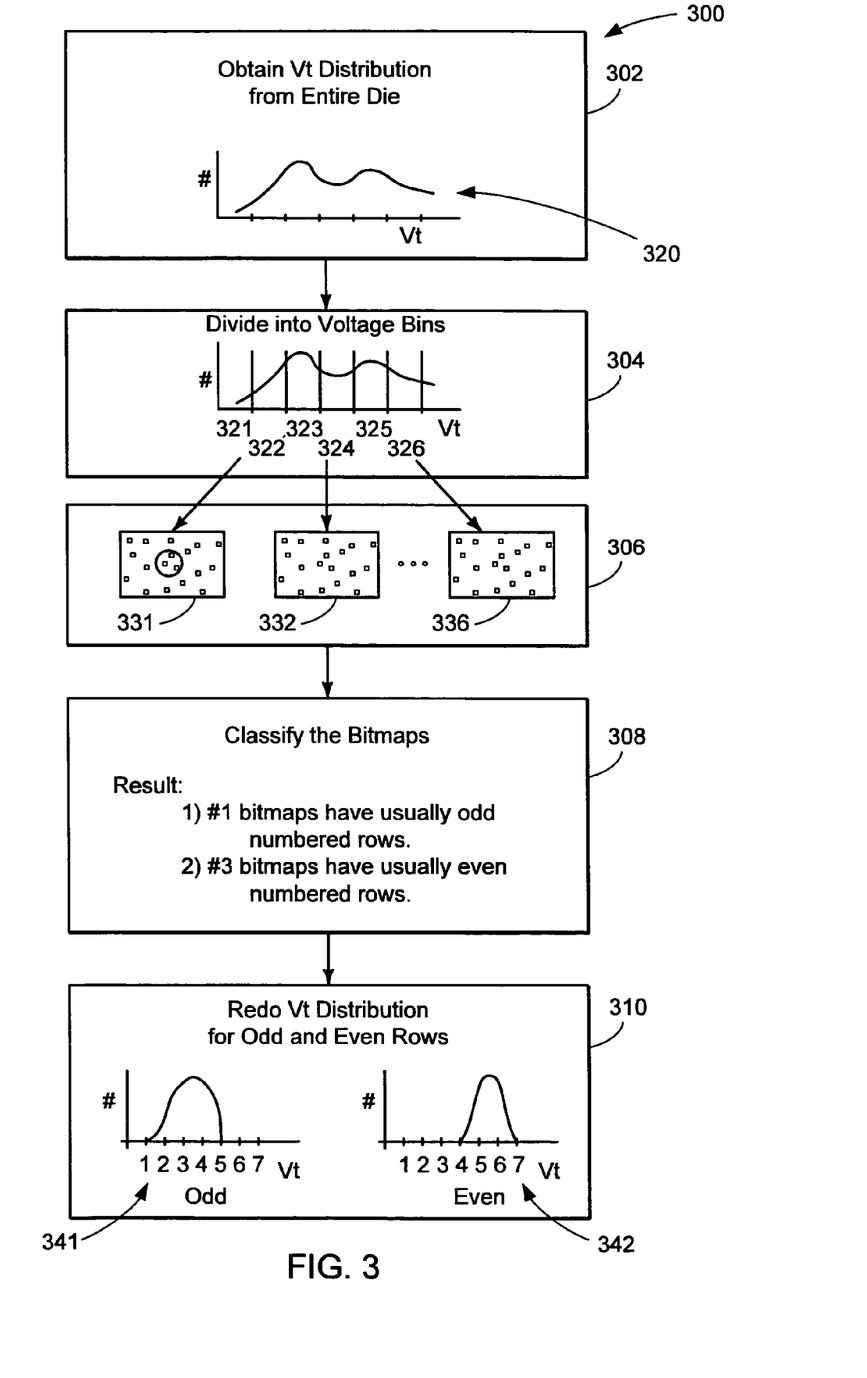
FIG. 3 is a system for automatically determining geographical location signatures in voltage threshold distributions of flash memory cells, or bits, in a flash memory die, according to the present invention.

Referring now to FIG. 3 therein is shown a system 300 for automatically determining geographical location signatures, such as the voltage threshold distributions of the number of bits 202, in a system under test, such as the die 200 of FIG. 2. It will be apparent to those skilled in the art that although the present invention is described in connection with voltage threshold distributions, the present invention may be used in connection with other geographical location signatures, such as current, resistance, heating, speed, and other ascertainable parameters.

By way of generalization and in one embodiment, the present invention can be implemented by a method that includes: obtaining a parameter distribution for sections of a system under test; categorizing the parameter distribution in a plurality of bins; generating maps for the sections in each of the plurality of bins; determining systematic signatures from the maps; and correlating the signatures with the locations thereof on the system under test.

Also by way of generalization and in an additional embodiment, the above method can be implemented by elements such as circuitry or software in a general purpose computer that includes: means for obtaining parameter distribution for sections of a system under test; means for categorizing the parameter distribution in a plurality of bins; means for generating maps for the sections in each of the plurality of bins; means for determining systematic signatures from the maps; and means for correlating the signatures with the location thereof on the system under test.

The system 300 shown in FIG. 3 includes: obtaining a voltage threshold distribution from the entire die in a block 302; dividing the bits and their locations by voltage thresholds into voltage bins in a block 304; creating bitmaps of the location of the bits in each voltage bin in a block 306; classifying the bitmaps to determine geographical location signatures in a block 308; and generating voltage threshold distributions for each geographically distinct region of the die based on the above classification in a block 310. In the block 302, the voltage threshold distribution may be plotted on a chart 320 including a voltage threshold versus number of bits chart having a number of peaks thereby extracting the data in accordance with the generation block 101 shown in FIG. 1.

In the block 304, the data in the chart 320 is divided into a number of bins 321 through 326, inclusive. In the block 306, a number of bitmaps 331 through 336, inclusive are created showing the bit locations of the bits in each of the voltage bins 321 through 326, respectively. Thus, as described in connection with the extraction block 102 shown in FIG. 1, the data is extracted and recombined into forms that are more useful.

In accordance with the analysis block 103 shown in FIG. 1, systematic row (or column) signatures are determined from the number of bitmaps 331 through 336, inclusive by using various types of signatures by mathematical methods, which include Fourier analysis, such as real time Fourier analysis, or by bitmap classification engines as shown in the block 308.

In the block 310, the signatures are used to generate voltage threshold distributions for each geographically distinct region of the die 200 of FIG. 2 and presented based on the signatures in accordance with the presentation block 104 shown in FIG. 1. For example, for odd rows in a chart for odd rows 341 or for even rows in a chart for even rows 342.

Figure 4:
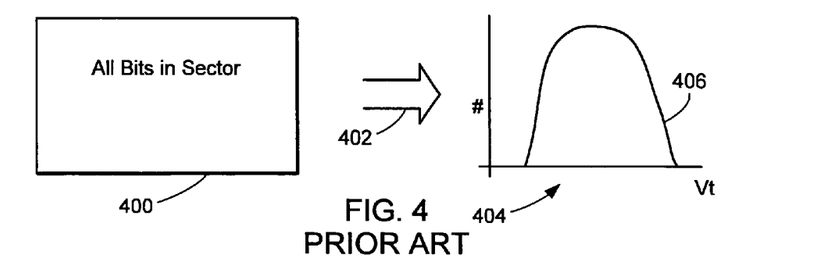
FIG. 4 (PRIOR ART) is a view of a standard voltage threshold distribution of all bits in a sector in a block.

Referring now to FIG. 4 (PRIOR ART), therein is shown a standard voltage threshold distribution of all bits in a sector in a block 400. As shown by a first arrow 402, processing to determine the voltage threshold distribution provides a chart 404 having a broad distribution 406 providing no information about systematic non-uniformities.

Figure 5:
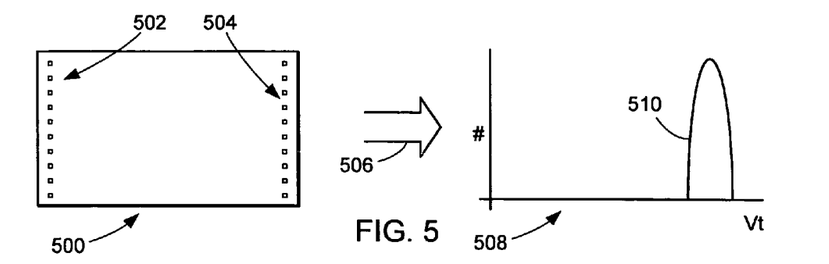
FIG. 5 is a view of a sector having first and last rows of bits, which are tested for threshold voltage distribution.

Referring now to FIG. 5, therein is shown a sector 500 having first and last columns of bits 502 and 504, respectively, which are tested for threshold voltage distribution. When charted as indicated by a second arrow 506, a chart 508 of number versus threshold voltage shows a possible first distribution 510, which is narrow at a certain voltage threshold voltage which shows a first systematic non-uniformity.

Figure 6:
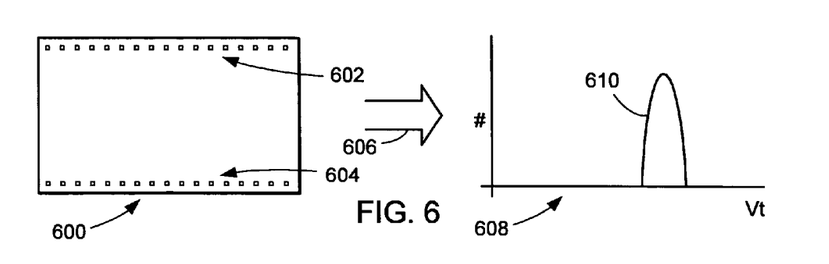
FIG. 6 is a view of a sector having top and bottom rows of bits, which are tested for threshold voltage distribution.

Referring now to FIG. 6 therein is shown a sector 600 having a top row of bits 602 and a bottom row of bits 604, which are tested for threshold voltage distribution. When charted as indicated by a third arrow 606, a chart 608 of number versus threshold voltage shows a possible second distribution 610, which is narrow at a certain voltage threshold voltage which shows a second systematic non-uniformity.

Figure 7:
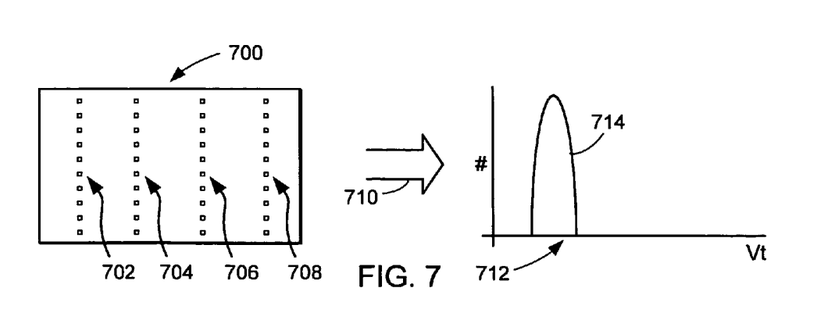
FIG. 7 is a view of a sector having evenly distributed columns, which are tested for threshold voltage distribution.

Referring now to FIG. 7, therein is shown a sector 700 having a first column of bits 702, a second column of bits 704, a third column of bits 706, and a fourth column of bits 708, which are tested for threshold voltage distribution. When charted as indicated by a fourth arrow 710, a fourth chart 712 of number versus threshold voltage will show a possible third distribution 714, which is narrow at a certain voltage threshold voltage, which shows a third systematic non-uniformity.

Figure 8:
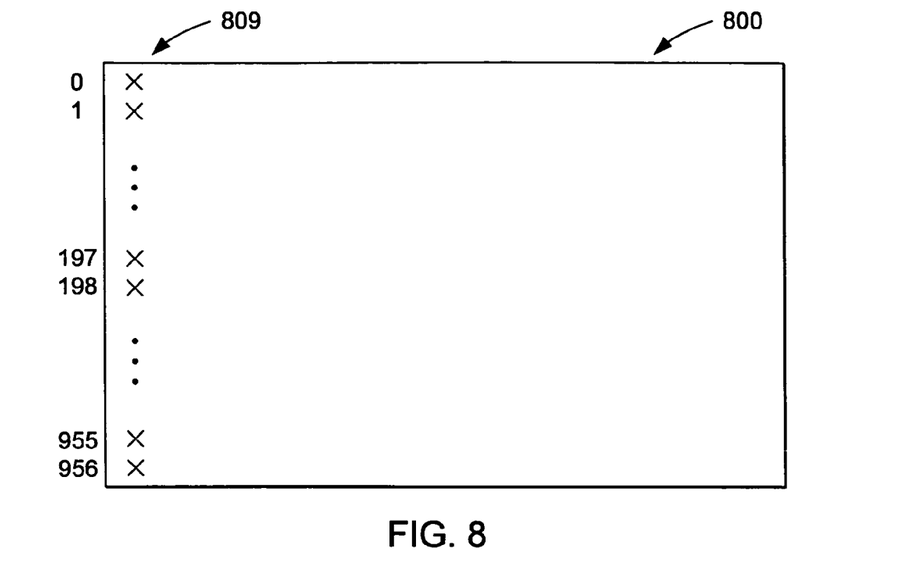
FIG. 8 is a view of a sector of a flash memory showing bits thereon.

Referring now to FIG. 8, therein is shown a sector 800 of flash memory having a number of bits 809. It has been discovered that by collecting drain current information, it is possible to calculate the threshold voltage, which is inversely proportional to the drain current. By collecting drain current data at different rows of the sector 800, such as the rows 0, 1, 197, 198, 955 and 956 shown in FIG. 8, it is possible to extrapolate the threshold voltages across the entirety of the sector 800.

Figure 9:
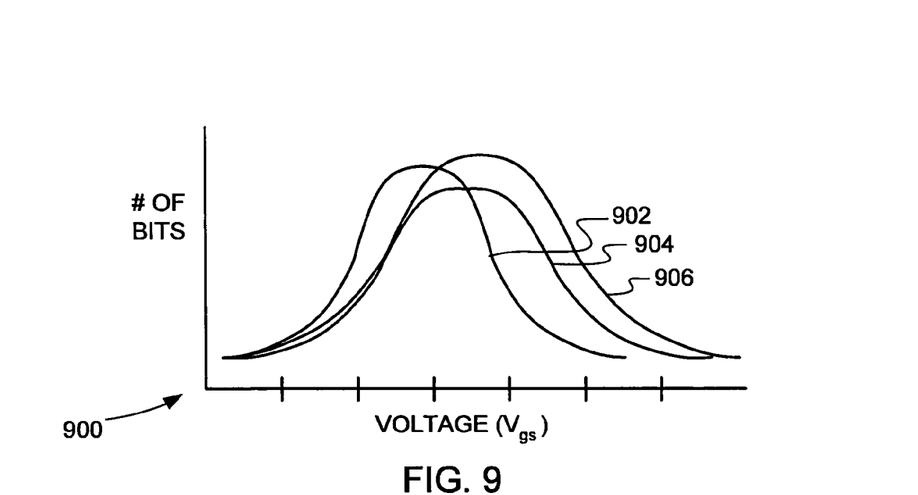
FIG. 9 is a plot of threshold voltage distribution curves of a semiconductor wafer under test.

Referring now to FIG. 9 therein is shown a plot 900 of threshold voltage distribution curves of transistors of a wafer under test. The plot 900 is extracted in the extraction block 109 shown in FIG. 1 from the threshold voltages generated in accordance with the generation block 101 shown in FIG. 1. The plot 900 includes a first threshold voltage distribution curve 902, a second threshold voltage distribution curve 904, and a third threshold voltage distribution curve 906. The threshold voltage distribution curves 902, 904, and 906 can be characterized by the formula:

$$N = a\frac{G(bVgs)}{f(cVgs)} \quad \text{(Equation 1)}$$

where: a, b, and c are coefficients,
G is the Gaussian function, and
f is a weight function.

The coefficients a, b, and c for acceptable threshold voltage distribution curves are determined by analyzing, in accordance with the analysis block 103 shown in FIG. 1, the threshold voltage distribution curves for reference sectors of the wafer under test to define acceptable ranges of coefficients. If any sector produces threshold voltage distribution curves with coefficients that fall outside the acceptable range, the location on the wafer is recorded and may be studied further to determine the cause for the unacceptable results.

Additionally, the threshold voltage distribution curves taken from sectors of wafers with known failures or problems can be collected and categorized to form a library of failure signatures associated with the known failures or problems in the form of coefficients for those curves. If future curves have coefficients falling within the range of the known failures or problems when compared to those in the library of failure signatures, the locations are recorded for further investigation of the failures or problems.

The signature curves preferably are color-coded to reflect a particular signature for presentation of the results in accordance with the presentation block 104 shown in FIG. 1. For example, acceptable curves can be color-coded in a particular color, such as green. A signature for a curve indicative of a "fast bit" can be color-coded a second different color, such as red. A signature for a curve indicative of a "fail to erase bit" can be color-coded with a third different color, such as blue.

Figure 10:
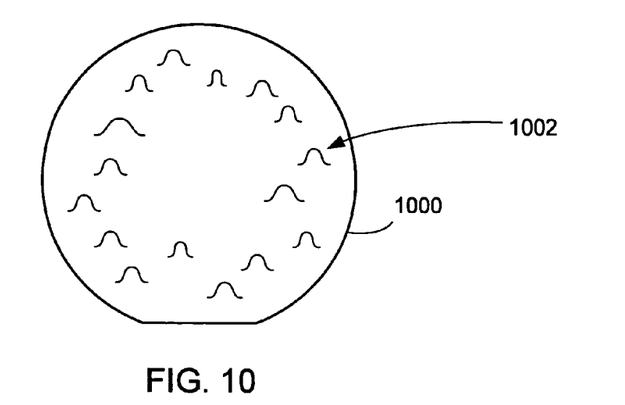
FIG. 10 is a map of a number of signatures of the threshold voltage distribution curves of the semiconductor wafer under test.

Referring now to FIG. 10 therein is shown a wafer map 1000 of a wafer showing a number of threshold voltage distribution curves 1002 mapped onto a depiction of a wafer by sector location in accordance with the presentation block 104 shown in FIG. 1.

The number of threshold voltage distribution curves 1002 derived using the present invention are mapped by at least one of their associated coefficients, color-coding, other visual identifier, and a combination thereof onto the wafer map 1000. There is thus presented a representation of the wafer under test to show easily and visually the types of signatures that are present as well as the sector location on the wafer where the signature is located.

Some of the sectors may be identified as reference sectors to define signature curves having acceptable ranges of coefficients of the threshold voltage distribution curves mapped onto the wafer map 1000. The preferable color-coding (not shown) of the number of threshold voltage distribution curves 1002 provides a visual representation of the wafer map 1000.

Figure 11:
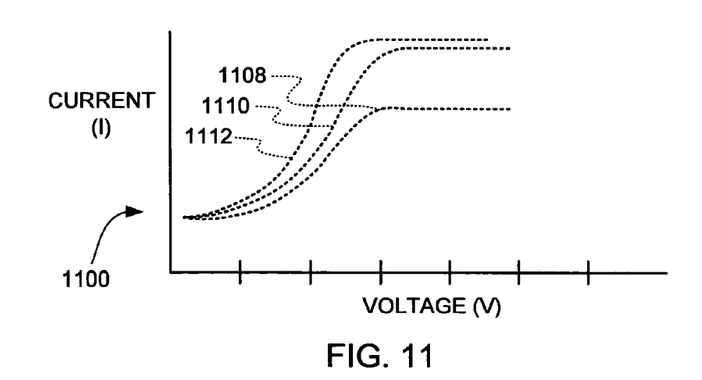
FIG. 11 is a plot of gate current distribution curves of a semiconductor wafer under test.

Referring now to FIG. 11 therein is shown a plot 1100 of gate current distribution curves of a wafer under test. The plot 1100 includes a first gate current distribution curve 1108, a second gate current distribution curve 1110, and a third gate current distribution curve 1112. Gate currents are measured in accordance with the generation block 101 shown in FIG. 1. The plot of gate current distribution curves 1108, 1110, and 1112 is then extracted in accordance with the extraction block 102 shown in FIG. 1.

The current distribution curves 1108, 1110, and 1112 can be characterized by the formula:

$$I(v)=af(v)+bg(v) \quad \text{(Equation 2)}$$

where: a and b are coefficients, and
f(v) and g(v) are identified functions of v.

The coefficients a and b for acceptable gate current distribution curves are determined by analyzing in accordance with the analysis block 103 shown in FIG. 1 the gate current distribution curves for reference sectors of the wafer under test to define acceptable ranges of coefficients. If any sector produces gate current distribution curves with coefficients that fall outside the acceptable range, the location on the wafer is recorded and may be studied further to determine the cause for the unacceptable results.

Figure 12:
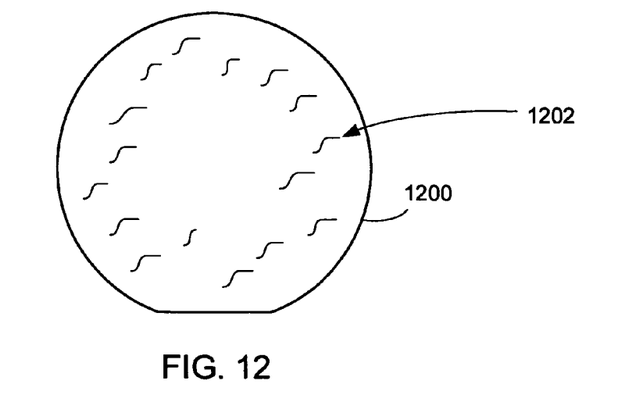
FIG. 12 is a map of a number of signatures of the gate current distribution curves of the semiconductor wafer under test.

Referring now to FIG. 12 therein is shown a map 1200 of a wafer showing a number of gate current distribution curves 1202 mapped onto a depiction of a wafer by sector location. Some of the sectors are identified as reference sectors to define signatures having acceptable ranges of coefficients of the number of gate current distribution curves 1202 mapped onto the map 1200.

Additionally, the number of gate current distribution curves 1202 taken from sectors of wafers with known failures or problems can be collected and categorized to form a library of failure signatures associated with the known failures or problems in the form of coefficients for those curves. If future curves have coefficients falling within the range of the known failures or problems, the locations are recorded for further investigation of the failures or problems.

The curves preferably are color-coded to reflect a particular signature. For example, curves having a range of coefficients in an acceptable range can be color coded in a first particular color, such as green. A signature for a curve indicative of a "fast bit" can be color-coded a different color, such as red. A signature for a curve indicative of a "fail to erase bit" can be color coded with a different color, such as blue.

In accordance with the presentation block 104 shown in FIG. 1, the signature curves derived using the present invention then can be mapped by at least one of their associated coefficients, color, other visual identifier, and a combination thereof onto a depiction of a wafer under test.

There is thus presented the map 1200 to show easily and visually the types of the number of gate current distribution curves 1202 that are present in a particular wafer under test. The sector locations on the wafer where the number of gate current distribution curves 1202 is located also are shown on the map 1200. The presentation of the data in accordance with the presentation block 104 shown in FIG. 1 is thereby facilitated.

Figure 13:
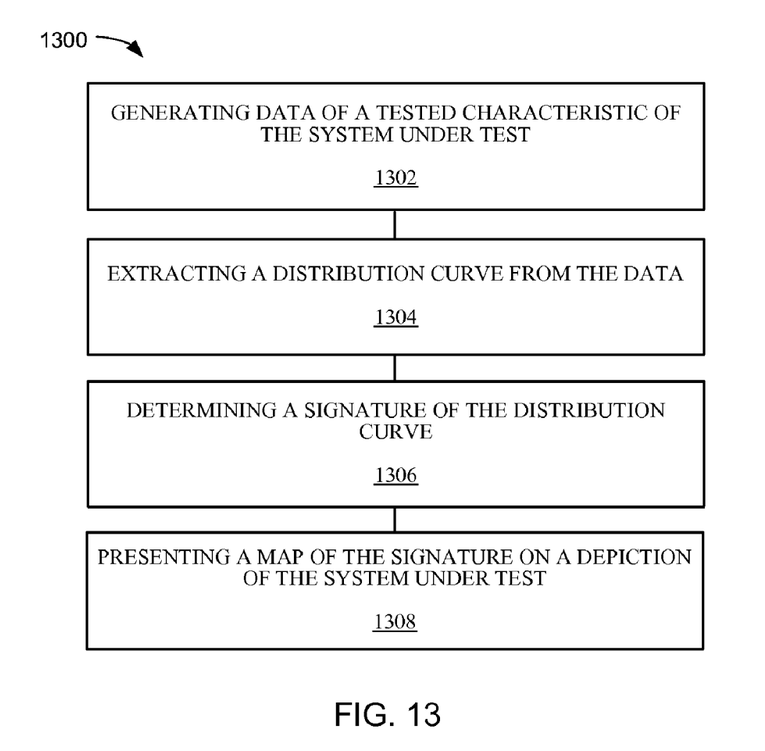
FIG. 13 is a flow chart of a method of the present invention.

Referring now to FIG. 13, therein is shown a flow chart of a method 1300 of the present invention. The method 1300 includes generating data of a tested characteristic of the system under test in a step 1302; extracting a distribution curve from the data in a step 1304; determining a signature of the distribution curve in a step 1306; and presenting a map of the signature on a depiction of the system under test in a step 1308.

The above also provides a method of hierarchical voltage threshold analysis.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method of processing test information of a semiconductor wafer under test comprising:
    generating data of the threshold voltage of the transistors on a semiconductor wafer under test;
    extracting a distribution curve from the data using the formula
    $$N = a\frac{G(bVgs)}{f(cVgs)},$$
    where Vgs is the threshold voltage, a, b, and c are coefficients, G is the Gaussian function, and f is a weight function;
    determining a signature of the distribution curve characterized by the coefficients of the formula; and
    presenting a map of the signature on a depiction of the semiconductor wafer under test.

2. The method as claimed in claim 1, wherein determining a signature of the distribution curve is determined using at least one of Fourier analysis, real-time Fourier analysis, a bitmap classification engine, and combinations thereof.

3. The method as claimed in claim 1, wherein determining a signature of the distribution curve classifies by locations of at least one of odd numbered rows, even numbered rows, odd numbered columns, even numbered columns, and a combination thereof.

4. The method as claimed in claim 1 wherein determining a signature of the distribution curve comprises:
    comparing the signature to a library of known signatures.

5. The method as claimed in claim 1, wherein determining a signature of the distribution curve further comprises:
    categorizing the distribution curve in a plurality of bins;
    generating maps for the sections in each of the plurality of bins; and
    determining a signature from the maps.

6. The method as claimed in claim 5 wherein generating maps comprises:
    identifying the signature using at least one of coefficients of the distribution curve, color-coding, visual indicators, and a combination thereof.

7. A method of processing test information of a semiconductor wafer under test comprising:
    generating data by measuring the gate current of the transistors on a semiconductor wafer under test;
    extracting the distribution curve of the data using the formula I(v)=af(v)+bg(v),
        where I is the gate current, v is the voltage, a and b are coefficients, and f(v) and g(v) are identified functions of v; and a signature of the distribution curve is characterized by the coefficients of the formula;
    determining a signature of the distribution curve characterized by the coefficients of the formula; and
    presenting a map of the signature on a depiction of the semiconductor wafer under test.

8. The method as claimed in claim 7, wherein determining a signature of the distribution curve is determined using at least one of Fourier analysis, real-time Fourier analysis, a bitmap classification engine, and combinations thereof.

9. The method as claimed in claim 7, wherein determining a signature of the distribution curve classifies by locations of at least one of odd numbered rows, even numbered rows, odd numbered columns, even numbered columns, and a combination thereof.

10. The method as claimed in claim 7 wherein determining a signature of the distribution curve comprises:
    comparing the signature to a library of known signatures.

11. The method as claimed in claim 7, wherein determining a signature of the distribution curve further comprises:
    categorizing the distribution curve in a plurality of bins;
    generating maps for the sections in each of the plurality of bins; and
    determining a signature from the maps.

12. The method as claimed in claim 7 wherein generating maps comprises:
    identifying the signature using at least one of coefficients of the distribution curve, color-coding, visual indicators, and a combination thereof.

13. A system for determining geographical location signatures of a semiconductor wafer under test comprising:
    means for generating data of the threshold voltage of the transistors on a semiconductor wafer under test;
    means for extracting a distribution curve from the data using the formula
    $$N = a\frac{G(bVgs)}{f(cVgs)},$$
    where Vgs is the threshold voltage, a, b, and c are coefficients, G is the Gaussian function, and f is a weight function;
    means for determining a signature of the distribution curve characterized by the coefficients of the formula; and
    means for presenting a map of the signature on a depiction of the semiconductor wafer under test.

14. The system as claimed in claim 13, wherein the means for determining the signature uses at least one of Fourier analysis, real-time Fourier analysis, a bitmap classification engine, and combinations thereof.

15. The system as claimed in claim 13, further comprising:
- means for categorizing the distribution curve in a plurality of bins;
- means for generating maps for the sections in each of the plurality of bins; and
- means for determining a signature from the maps.

16. The system as claimed in claim 13, wherein the means for determining a signature comprises:
- means for classifying by locations of at least one of odd numbered rows, even numbered rows, odd numbered columns, even numbered columns, and a combination thereof.

17. A system for determining geographical location signatures of a semiconductor wafer under test comprising:
- means for obtaining a voltage threshold distribution for sections of the semiconductor wafer under test using the formula:

$$N = a\frac{G(bVgs)}{f(cVgs)},$$

where Vgs is the threshold voltage, a, b, and c are coefficients, G is the Gaussian function, and f is a weight function; and a signature of the distribution curve is characterized by the coefficients of the formula;
- means for categorizing the voltage threshold distribution in a plurality of bins;
- means for generating bitmaps for the sections in each of the plurality of bins;
- means for determining systematic signatures from the bitmaps; and
- means for correlating the systematic signatures with the locations thereof on the semiconductor wafer under test.

18. The system as claimed in claim 17, wherein the means for determining systematic signatures uses at least one of Fourier analysis, real-time Fourier analysis, a bitmap classification engine, and combinations thereof.

19. The system as claimed in claim 17, wherein the means for determining systematic signatures comprises:
- means for classifying by locations of at least one of odd numbered rows, even numbered rows, odd numbered columns, even numbered columns, and a combination thereof.

20. A system for determining geographical location signatures of a semiconductor wafer system under test comprising:
- means for obtaining a gate current distribution for sections of the semiconductor wafer system under test using the formula:

$$I(v)=af(v)+bg(v),$$

where I is the gate current, v is the voltage, a and b are coefficients, and f(v) and g(v) are identified functions of v; and a signature of the distribution curve is characterized by the coefficients of the formula;
- means for categorizing the gate current distribution in a plurality of bins;
- means for generating bitmaps for the sections in each of the plurality of bins;
- means for determining systematic signatures from the bitmaps; and
- means for correlating the systematic signatures with the locations thereof on the semiconductor wafer system under test.

21. The system as claimed in claim 20, wherein the means for determining systematic signatures uses at least one of Fourier analysis, real-time Fourier analysis, a bitmap classification engine, and combinations thereof.

22. The system as claimed in claim 20, wherein the means for determining systematic signatures comprises:
- means for classifying by locations of at least one of odd numbered rows, even numbered rows, odd numbered columns, even numbered columns, and a combination thereof.

* * * * *